United States Patent [19]
Byun et al.

[11] Patent Number: 5,917,199
[45] Date of Patent: Jun. 29, 1999

[54] SOLID STATE IMAGER INCLUDING TFTS WITH VARIABLY DOPED CONTACT LAYER SYSTEM FOR REDUCING TFT LEAKAGE CURRENT AND INCREASING MOBILITY AND METHOD OF MAKING SAME

[75] Inventors: Young Hee Byun, Novi; Yiwei Lu, Arbor, both of Mich.

[73] Assignee: OIS Optical Imaging Systems, Inc., Northville, Mich.

[21] Appl. No.: 09/079,225

[22] Filed: May 15, 1998

[51] Int. Cl.⁶ ............................................. H01L 29/04
[52] U.S. Cl. ................. 257/59; 257/32; 257/72; 257/213; 257/343; 257/347; 257/350; 438/30; 438/149; 438/159; 438/233
[58] Field of Search .................... 257/343, 347–353, 257/32, 59, 72, 66, 213; 438/30, 149, 159, 233

[56] References Cited

U.S. PATENT DOCUMENTS

| | | |
|---|---|---|
| 5,079,426 | 1/1992 | Antonuk et al. . |
| 5,381,014 | 1/1995 | Jeromin et al. . |
| 5,396,072 | 3/1995 | Schiebel et al. . |
| 5,532,180 | 7/1996 | den Boer et al. . |
| 5,614,427 | 3/1997 | den Boer et al. . |
| 5,641,974 | 6/1997 | den Boer et al. . |
| 5,650,358 | 7/1997 | Gu et al. . |
| 5,718,800 | 2/1998 | Juengling . |

*Primary Examiner*—Fetsum Abraham
*Attorney, Agent, or Firm*—Joseph A. Rhoa

[57] ABSTRACT

A TFT structure includes a variably doped contact layer system in order to reduce leakage current characteristics and increase mobility of the TFT. Such TFTs may be utilized in, for example, X-ray imagers or liquid crystal displays. In certain embodiments, the contact layer system is lightly doped adjacent a semiconductor or channel layer, and is more heavily doped adjacent the source/drain electrodes. The variation in doping density of the contact layer system may be performed in a step-like manner, gradually, continuously, or in any other suitable manner. In certain embodiments, the contact layer system may include a single layer which is deposited over an intrinsic semiconductor layer, with the amount of dopant gas being used during the deposition process being adjusted through the deposition of the single layer so as to cause the doping density to vary (increase or decrease) throughout the thickness of the system/layer.

20 Claims, 10 Drawing Sheets

5,917,199

SOLID STATE IMAGER INCLUDING TFTS WITH VARIABLY DOPED CONTACT LAYER SYSTEM FOR REDUCING TFT LEAKAGE CURRENT AND INCREASING MOBILITY AND METHOD OF MAKING SAME

This invention relates to a thin film transistor (TFT) structure for use in, for example, imaging devices and liquid crystal display (LCD) devices. More particularly, this invention relates to a TFT structure having at least one variably doped contact layer system for reducing leakage current and increasing mobility in TFTs.

BACKGROUND OF THE INVENTION

Electronic matrix arrays find considerable application in devices such as imagers (e.g. X-ray imagers) and LCDs. Such devices typically include x and y (or row and column) address lines which are horizontally and vertically spaced apart and cross at an angle to one another thereby forming a plurality of crossover points. Associated with each crossover point is an element (i.e. pixel) to be selectively addressed. The element may be a pixel of an imager array, or alternatively a pixel of an LCD.

Typically, a switching or isolation device such as a thin film transistor (TFT) is associated with each element or pixel in order to permit individual pixels in the imager or LCD to be selectively addressed (i.e. driven in LCD applications and read in imager applications).

Structurally, TFTs typically include source, drain, and gate electrodes, with a thin film of semiconductor material (e.g. amorphous silicon or a-Si) disposed between the source and drain electrodes, and the gate electrode in proximity to the semiconductor but electrically insulated therefrom by a gate insulator. A typical bottom-gate TFT is shown, for example, in U.S. Pat. No. 5,641,974, the disclosure of which is hereby incorporated herein by reference.

Current flow through the TFT between the source and drain electrodes is controlled by the application of voltage to the gate electrode. As shown in FIG. 1, the application of voltage to the gate produces an electric field which accumulates a charged region in the semiconductor layer (e.g. intrinsic a-Si). This charged region forms a current conducting channel in the semiconductor through which current flows between the source and drain electrodes of the TFT. For example, when zero or a negative voltage is applied to the gate, the TFT will be in an off-state and little or no current will flow between the source and drain. However, when a positive voltage (e.g. +10 volts) is applied to the gate, this causes the conducting channel to form and permits current to flow between the source and drain electrodes of the TFT.

FIG. 1 is a symbolic diagram of a typical TFT in an LCD showing a current path from the drain terminal to the source terminal (A→B→C→D) when the n-channel TFT turns on (i.e. $V_d > 0$ volts, $V_g > V_{th}$, $V_s = 0$ volts). $R_s$, $R_d$, and $R_{ch}$ represent source series resistance, the drain series resistance, and the channel resistance, respectively. $V_d$ is the drain voltage. $V_g$ is the gate voltage. $V_s$ is the source voltage. $V_{th}$ is the threshold voltage (e.g. 1 volt for n-channel TFTs) which when exceeded results in the TFT being in the on-state.

Herein, the "source" electrode of a TFT will be referred to as the electrode which is to be electrically in communication with a pixel electrode (e.g. connected to a pixel electrode in an LCD or to a pixel or collector electrode in an imager). Thus, the "drain" electrode of TFTs herein will be referred to as the electrode which electrically communicates with a data or address line and which is spaced from the corresponding source electrode.

Thus, in LCD applications for example, when a voltage (e.g. +10 volts) is applied to the gate and at the same time a video voltage (e.g. +5 volts) is applied via a data address line to the drain of a TFT, the conductive channel is formed in the semiconductor layer and current flows therethrough from the drain to the source powering the pixel electrode in the LCD so as to charge the corresponding liquid crystal (LC) pixel of the display. The pixel is then in an "on-state." In LCD applications, the source typically reaches a voltage similar to that supplied to the drain via the data line in the on-state. The amplitude of voltage applied to the drain via the data line thus determines how much voltage will be applied across the liquid crystal material in a given pixel and thus controls gray scale levels in the display. When voltage is no longer applied to the gate (or drops below $V_{th}$), the pixel stops charging but remains on until the next frame. Unfortunately, TFT leakage current can cause current to leak from the source to the drain through the semiconductor layer when the pixel is in an on-state and the TFT is in an off-state, thereby unintentionally and undesirably changing the amount of voltage across the liquid crystal (LC) material in the pixel and adversely affecting gray scales and shading in the display (i.e. undesirable discharging of the pixel). This leakage current is an undesirable characteristic associated with conventional TFTs.

In, for example, X-ray imager applications, the source of a TFT is typically electrically connected to a collector electrode of a given pixel. The collector electrode receives a voltage which is a function of the amount of X-ray radiation received in a corresponding area of the imager. A pixel or collector electrode in an imager may receive from about 1 to 30 volts, depending upon the amount of radiation received by that area of the imager. The drain electrode in imager TFTs is typically connected to a data line having a constant voltage (i.e. virtual ground line defining a reference voltage such as 0 volts, 5 volts, or the like). When a voltage is supplied to the gate of a TFT in an imager in order to cause the TFT to go into an "on-state", current flows from the source to the drain so that the pixel or storage capacitor may be "read" with the voltage read from the collector electrode indicating how much radiation a given area of the imager received in a frame. Again, leakage characteristics of TFTs may allow current to flow from the source to the drain when no voltage is applied to the gate thereby allowing the imager pixel (or storage capacitor) to unintentionally discharge. This is undesirable because the voltage read out when the TFT is turned on will not be directly indicative of the radiation received.

Accordingly, a TFT's leakage current is a critical parameter determining the overall image quality of both LCDs and imagers (e.g. scanners, X-ray imagers, etc.). It is known that high TFT leakage current degrades performance of a display by yielding non-uniform gray levels, crosstalk, shading, flicker, and/or image sticking, and degrades imager performance by yielding dynamic range reduction, shading, and/or non-uniform image. In typical LCD or AMLCD applications, TFTs are biased such that $V_{ds}$ ranges from 0 to 10 volts in the off-state, and $V_{gs}$ from −3 to −6 volts in the off-state. In X-ray imagers, TFTs operate at higher $V_{ds}$ values in the off-state (i.e. collector or pixel electrodes in such imagers can receive up to 30 volts in certain applications). Thus, TFTs in X-ray imagers and other imagers are in need of extremely low leakage current characteristic in order to minimize leakage when TFTs are in the off-state.

Numerous attempts have been made to minimize TFT leakage current. For example, for crystalline-silicon and polycrystalline silicon TFTs, LDD (lightly doped drain) or drain offset structures have been introduced. However, that approach requires additional process steps (i.e. photo, ion implantation, etc.).

Leakage current in amorphous silicon (a-Si) TFTs, such as that disclosed in U.S. Pat. No. 5,641,974, has been understood as follows. Firstly, bulk leakage current may be caused by hole conduction. Holes are provided via thermal generation, field enhanced thermal generation (Pool-Frenkel barrier lowering), and/or tunneling (band-to-band or trap-to-band) in the high electric field region near the source/drain. Secondly, bulk leakage current may be caused by the introduction of density-of-state peak in the upper-half of the energy band gap. Thirdly, surface leakage current may be caused by band-bending at the interface between the top channel layer (e.g. a-Si layer) and the dielectric or passivation layer overlying same. This leakage current is sensitive to density-of-state or fixed charge at the interface, and only applies to bottom-gate TFTs. Finally, gate leakage current can be caused by any leakage via the gate dielectric layer (e.g. silicon nitride layer).

With reference to the immediately preceding paragraph, the bulk leakage current caused by carrier generation due to high electric fields has been found to be the most dominant, and the most difficult to address in terms of manufacturability of imagers and/or LCDs without significantly changing TFT structures or adding process steps.

It is apparent from the above that there exists a need in the art for an improved TFT structure and method of making same, where the TFT, or an array thereof, may be used in, for example, imager or LCD applications. The new structure and method should result in TFTs with reduced leakage current and increased mobility, without adversely affecting TFT manufacturing and/or processing steps.

Conventional TFTs typically have a contact layer between (i) the intrinsic semiconductor layer, and (ii) the source and drain electrodes. For example, see U.S. Pat. Nos. 5,641,974 and 5,532,180. These contact layers may be a-Si doped with an impurity such as phosphorus as disclosed in these two patents. These contact layers have a substantially constant doping density throughout the entire thickness of the contact layers, which results in off-state leakage characteristics in certain applications.

It is a purpose of this invention to fulfill the above-described needs in the art, as well as other needs which will become apparent to the skilled artisan from the following detailed description of certain embodiments of this invention.

SUMMARY OF THE INVENTION

Generally speaking, this invention fulfills the above-described needs in the art by providing a thin film transistor (TFT) structure comprising:

a substrate;

a conductive gate electrode in communication with a gate address line;

a conductive drain electrode in communication with a drain address lines;

a conductive source electrode in communication with a device (e.g. imager or LCD) electrode;

a TFT channel defined between the source and drain electrodes;

a semiconductor layer defining a current flow channel between the source and drain electrodes, the semiconductor layer being disposed between (i) the gate electrode, and (ii) the source and drain electrodes; and a semiconductor-inclusive variably doped contact layer system including at least one layer, the variably doped contact layer system contacting the semiconductor layer and at least one of the source and drain electrodes, the contact layer system being variably doped through its thickness in order to reduce TFT off-state leakage current.

The TFT structure may be used as one in an array of similar TFT structures in, for example, liquid crystal displays, X-ray imagers, or any other device.

This invention further fulfills the above-described needs in the art by providing a method of making a TFT structure, the method comprising the steps of:

providing a substrate;

providing a gate electrode on the substrate;

providing source and drain electrodes on the substrate;

forming a semiconductor layer on the substrate;

depositing a variably doped contact layer system, including at least one layer, on the substrate in a position so that the variably doped contact layer system is disposed at least partially between the semiconductor layer and the source electrode; and the depositing step further including utilizing a plurality of gases during the depositing in order to deposit the contact layer system, the gases including at least a dopant gas and a semiconductor or source gas and wherein the dopant gas and the semiconductor or source gas define a gas volume, and during the depositing step the amount of dopant gas provided in the gas volume is increased from a first percentage amount to a higher second percentage amount by volume in order to increase the doping density of the contact layer system throughout the thickness of the contact layer system so as to reduce off-state leakage current and/or mobility characteristics of the TFT.

This invention will now be described with reference to certain embodiments thereof as illustrated in the following drawings.

IN THE DRAWINGS

FIG. 1 is a side cross sectional diagram of a conventional TFT showing a current path from the drain to the source when the n-channel TFT turns on.

FIG. 2 is a graph or qualitative representation of the electrostatic potential distribution of a conventional TFT vs. a TFT according to an embodiment of this invention along the current path from the drain terminal to the source terminal when the n-channel TFT turns on.

DETAILED DESCRIPTION OF CERTAIN EMBODIMENTS OF THIS INVENTION

Figure 1:
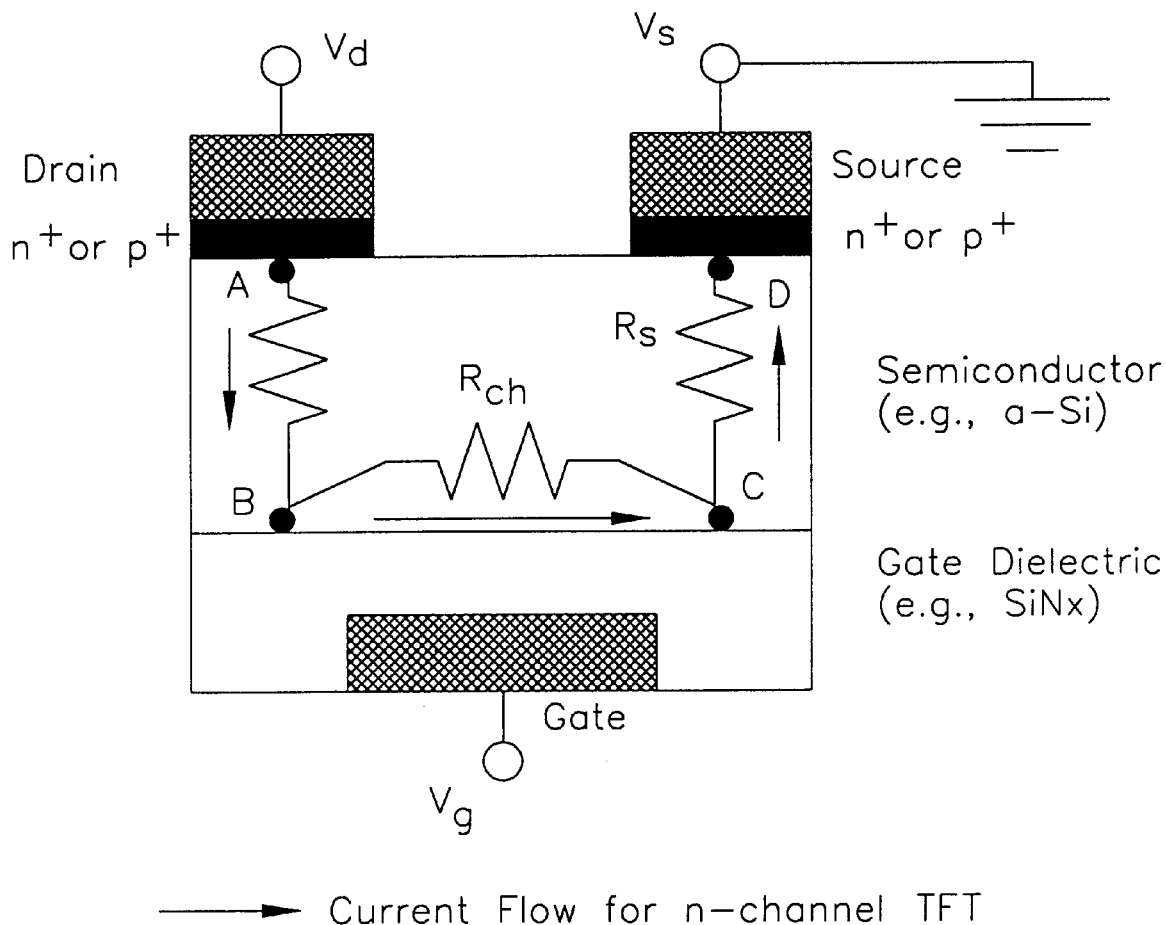

Referring now more particularly to the accompanying drawings in which like reference numerals indicate like parts throughout the several views.

According to certain embodiments of this invention, thin film transistors (TFTs) are manufactured so as to have low leakage current and high mobility relative to certain conventional TFTs. These TFTs may be used in imagers (e.g. X-ray imagers), LCDs, and any other device.

A variably doped contact layer system is provided between the semiconductor layer and the source/drain electrode(s). The presence of different dopant densities (negatively or positively doped) through the thickness of the contact layer system suppresses high electric fields at the interface between the contact layer system and the semiconductor layer (i.e. channel layer) when the TFT is in an off-state. Lowering of the field in such a manner weakens the carrier generation and reduces leakage current in the TFT, even when high fields are present.

When a TFT turns on, in an LCD for example, the current flows from the drain terminal to the source terminal (in an imager, it flows from the source to the drain as the storage capacitor is read out) and must pass through the semiconductor layer (e.g. intrinsic a-Si) vertically as shown in FIG. 1. The vertical current is so called the SCLC (space-charge-limited-current) determined mainly by the deposition parameters of the semiconductor film. Low SCLC causes current crowding (low mobility) in current-voltage characteristics at small drain voltages. It degrades the overall performance of displays and imagers.

In order to improve the current crowding of the SCLC, the intrinsic a-Si layer thickness may be thinned and the defect density-of-state in the intrinsic a-Si lowered. Unfortunately, these requirements sacrifice device uniformity and throughput. However, the instant invention increases the mobility of TFTs by reducing the current crowding without sacrificing device performance, throughput, and/or yield, and does not require additional processing steps or equipment.

Figure 2:
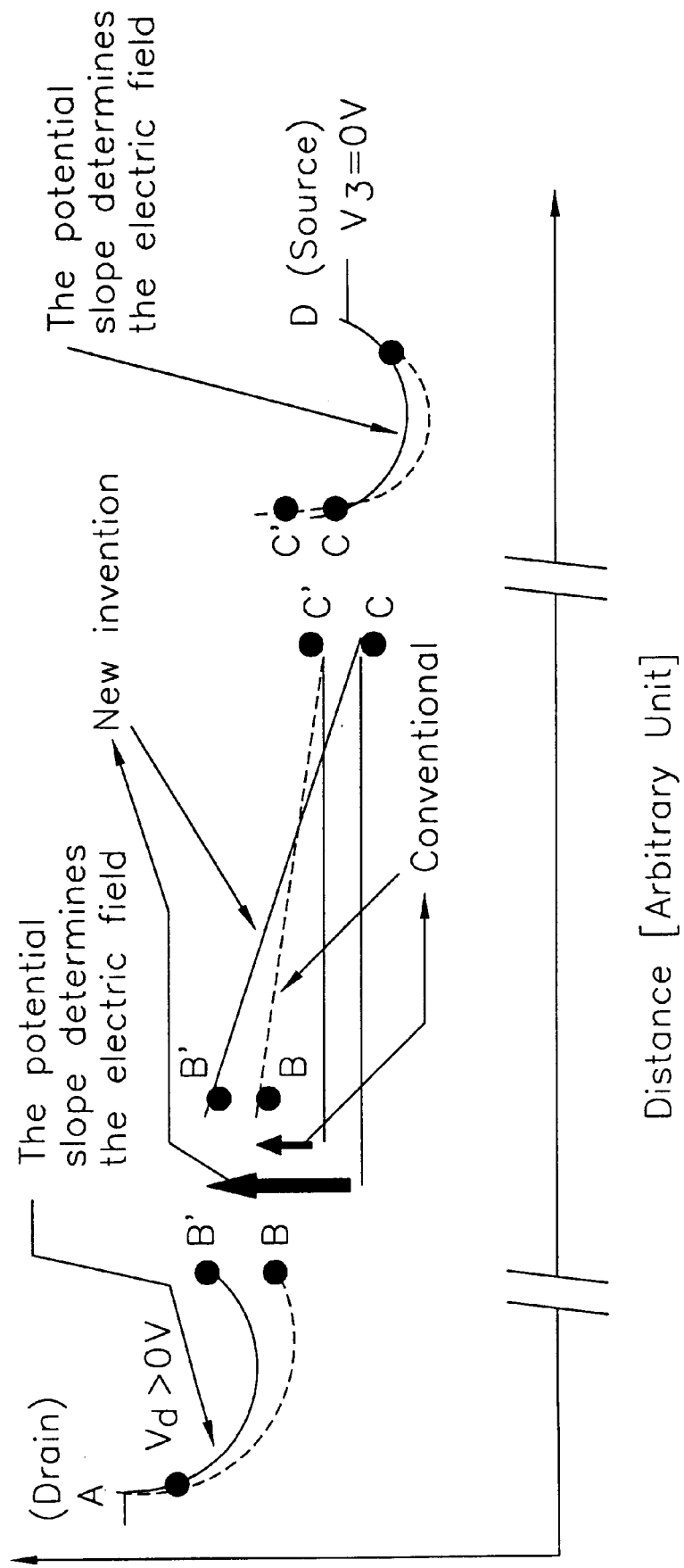

As shown in FIG. 1, the SCLC mechanism can be explained by the series resistance which increases the potential drop between A and B or between C and D. FIG. 2 compares qualitatively the electrostatic potential profile along the current path (ABCD) between conventional TFTs and TFTs in accordance with certain embodiments of this invention. In a TFT structure in accordance with this invention with a variably doped n+ or p+ contact layer system, the potential difference between A and B' or between C' and D becomes small or less since the electric field at the n+ or p+/intrinsic a-Si interface (A and D) is reduced even at the on-state. In other words, the series resistance $R_s$ and $R_d$ becomes smaller. Then, more potential drop occurs across the active channel between B' and C' along the intrinsic a-Si/SiNx interface. The channel resistance $R_{ch}$ becomes smaller and the current flows more. Therefore, the effective mobility of TFTs according to certain embodiments of this invention is increased.

Figure 13:
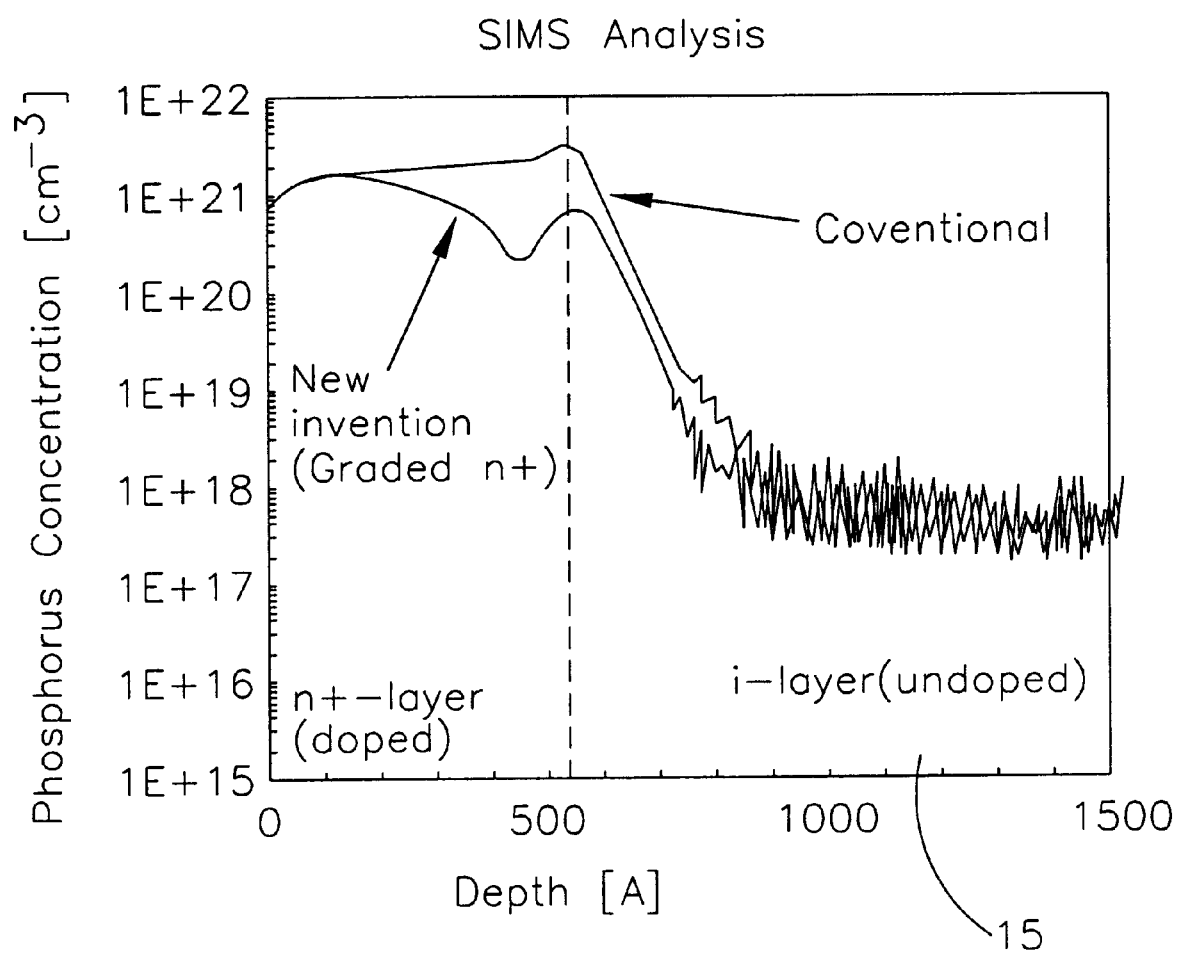
FIG. 13 is a graph showing a SIMS analysis of the phosphorous dopant density profiles for intrinsic a-Si and contact layers of conventional TFTs and TFT in certain embodiments of this invention (graded n+ layer).

In certain embodiments of this invention, the contact layer system may be made up of either (a) a plurality of different contact layers which are differently doped, or (b) a single contact layer having a continuously varying doping density which either increases or decreases through substantially the entire thickness of the layer (or at least a part of the layer). In either case (a) or (b), the n+ or p+ doped contact layer system has a doping density gradient (variable doping density through the thickness of the system) from the portion adjacent the semiconductor or channel layer to the portion adjacent the source/drain electrodes of the TFT. For example, the contact layer system adjacent the source/drain metal may have a high doping density relative to the portion of the system adjacent the channel or semiconductor layer. The contact layer portions therebetween can also be differently doped so that the density of doping varies in a step-like manner and is highest (+) adjacent the source/drain and lowest (−) adjacent the semiconductor or channel layer (e.g. see FIG. 9). Alternatively, instead of a step-like variation in doping density, the doping density of the contact layer system can vary in a continuous or gradual manner (e.g. see FIG. 10), a multiple quantum-well shape, or a combined shape in doping profile. However, it is important that the doping density of the contact layer system is higher than the majority of the channel doping as illustrated in FIG. 13.

Certain embodiments of this invention relate to and are applicable to TFTs which are field-effect transistors fabricated by thin film deposition. The film may be any crystal-like structure, including crystalline, polycrystalline, or amorphous (e.g. a-Si) film. TFT structures herein may be utilized in conjunction with any shape of channel area, including but not limited to linear channel TFTs, rectangular channel TFTs, circular shape TFTs, L-shaped TFTs, or any other irregular-shaped TFTs. Still further, TFT structures herein are applicable to bottom-gate BCE (back channel etch) a-Si TFTs (see FIG. 5), as well as any other type of TFT with highly doped n+ or p+ layers for providing good ohmic contact to the source/drain metal(s) [or any other source/drain conductive material such as indium tin oxide or ITO]. Certain embodiments of this invention are thus also applicable to top-gate TFTs (see FIG. 7) and bottom gate TL (trilayer) TFTs, for example.

Advantages associated with certain embodiments of this invention include TFT structures which maintain low leakage current even at high field or for short-channel TFTs, increased TFT mobility, applicability to AMLCD and imager manufacturing processes since no additional process steps or equipment is required, and/or no reduction in on-state TFT current flow between the source and drain.

Figure 3:
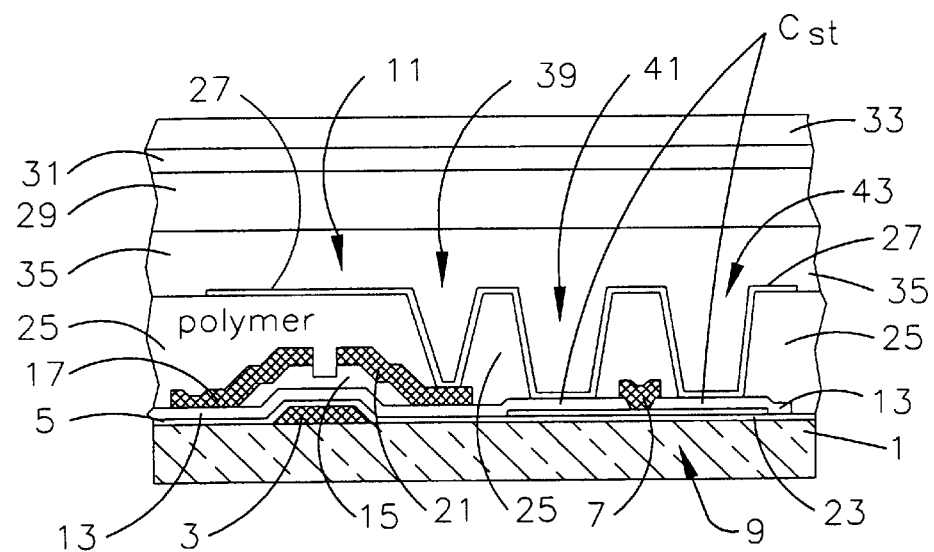
FIG. 3 is a side cross-sectional view of a pixel in an imager, this pixel including a TFT in accordance with an embodiment of this invention.

FIG. 3 is a side cross sectional view of an imager (e.g. X-ray imager) pixel, wherein a bottom-gate TFT structure 11 in accordance with an embodiment of this invention is provided. The imager includes an array of the illustrated TFTs 11 across substrate 1 as is known in the art. The imager of FIGS. 3 and 4 includes in each pixel substantially transparent substrate 1 (e.g. glass) upon which TFT gate electrode 3, gate insulating layer 5 (e.g. silicon nitride), ground address line 7, storage capacitor 9 including two capacitance portions $C_{ST}$, switching TFT 11, second dielectric and gate insulating layer 13 (e.g. silicon nitride), intrinsic or substantially undoped a-Si semiconductor or channel layer 15, TFT drain electrode and address line 17, gate address line 19 (e.g. Ta), TFT source electrode 21, a via or contact hole formed in dielectric layer 13 (e.g. silicon nitride) so as to allow conductive ground line 7 to contact bottom electrode 23 of storage capacitor 9, a TFT channel defined between the source and drain electrodes, organic photo-imageable passivation or insulating layer 25 (e.g. FujiClear™ acrylic) for improving the signal-to-noise ratio of the imager, substantially transparent collector electrode 27 (upper electrode) of storage capacitor 9, and bottom electrode 23 of storage capacitor 9. Blanket photoconductor layer 29 (e.g. Se, PbI$_2$, or the like), blanket insulator layer 31, and blanket metal top electrode 33 are provided on substrate 1 over interface barrier layer 35 and TFTs 11, with each of these blanket layers extending substantially continuously across the entire imaging area of the substrate 1.

Figure 4:
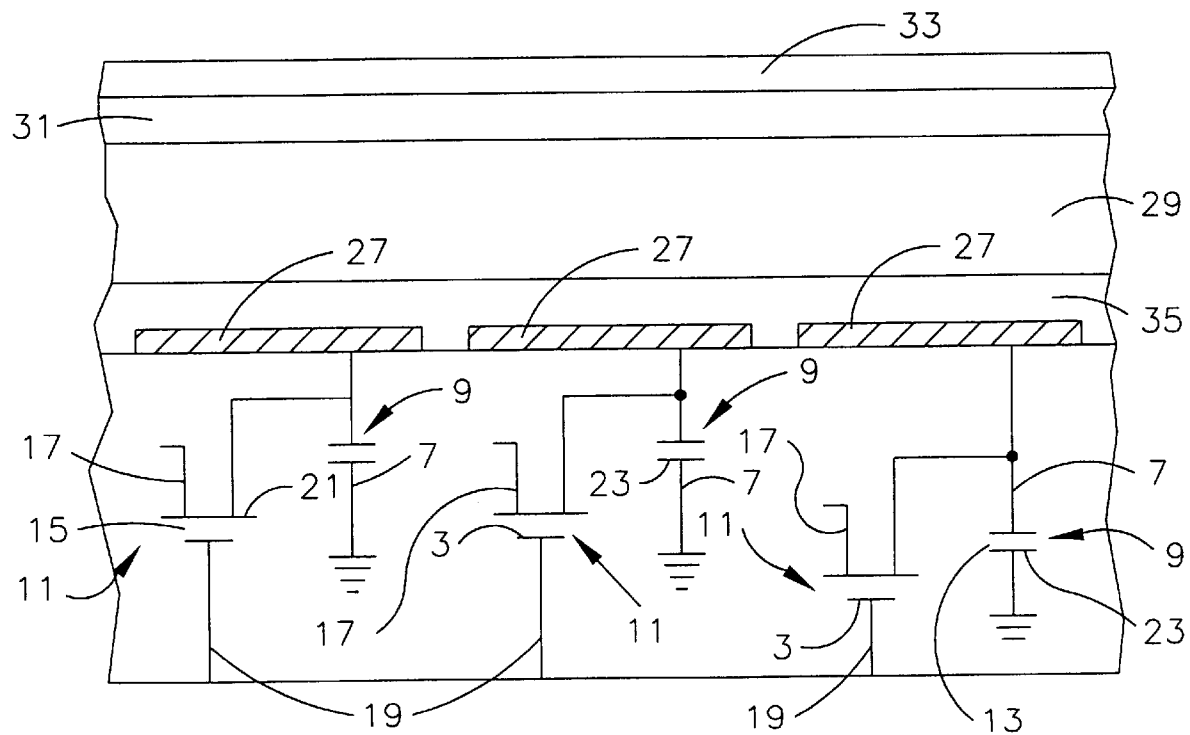
FIG. 4 is a partial cross-sectional and partial schematic illustration of a plurality of pixels, and TFTs, of the FIG. 3 imager.

Still referring to FIGS. 3 and 4, each storage capacitor collector electrode 27 is in electrical communication with (directly contacting in some embodiments) a corresponding TFT source electrode 21 through a via or contact hole 39 defined in substantially transparent insulation layer 25. A first array of vias 39, a second array of vias 41, and a third array of vias 43 may be defined in layer 25 across substrate 1. Vias 39 enable the collector electrodes to contact source electrodes 21, while the second and third array of photo-imaged vias enable each collector electrode 27 to form two parts of each storage capacitor 9 as illustrated in the pixel of FIG. 3.

The FIGS. 3–4 imager functions as a direct conversion imager as described and disclosed in commonly owned U.S. Ser. No. 09/012,491, the disclosure of which is incorporated herein by reference. Thus, during operation, a high voltage of several kV is applied to top electrode 33, causing the electrons and holes generated by received X-ray photons to separate. Positive charge is collected on the corresponding storage capacitor 9 and read out by the corresponding TFT in a manner known in the art when a voltage (e.g. +10 volts) is applied to the gate electrode 3 to cause the TFT to be in the on-state. It should be recognized that TFTs of all embodiments herein are also applicable to indirect types of imagers.

Figure 5:
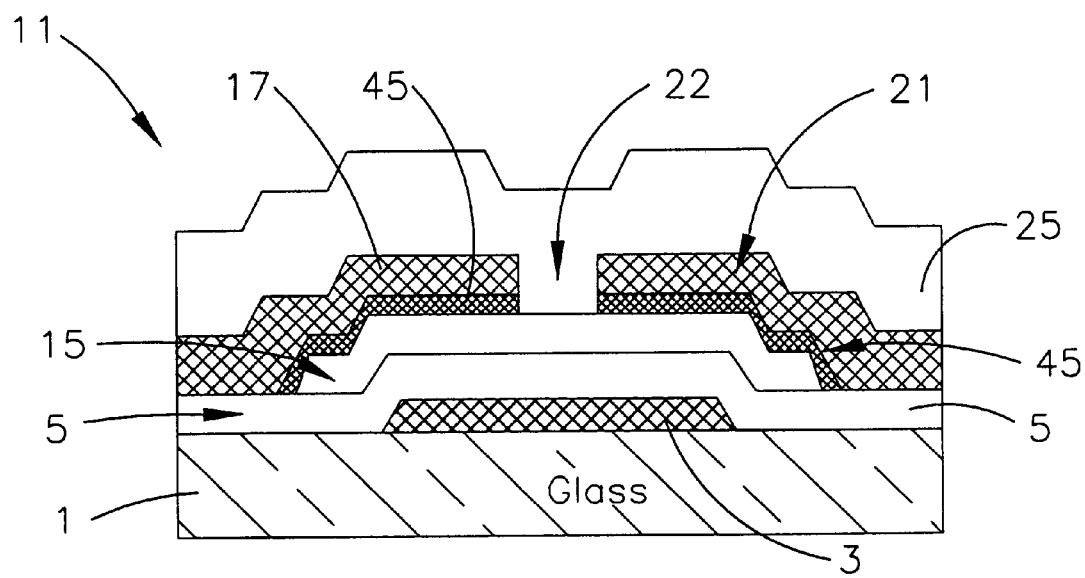
FIG. 5 is a side cross-sectional view of a bottom-gate TFT in accordance with the FIGS. 3–4 embodiment of this invention, although this TFT may also be used in applications other than imagers, such as in liquid crystal displays.

FIG. 5 is a side cross sectional view of bottom-gate TFT 11 of the FIGS. 3–4 embodiment of this invention. The TFT of FIG. 5 may also be used in other applications, including in LCDs and other types of displays and/or imagers.

Referring to the TFT structure of FIG. 5, it includes substrate 1, gate electrode 3, gate insulating layer 5 (e.g. silicon nitride), intrinsic semiconductor or channel layer 15 (e.g. a-Si), variably doped contact layer system 45 which is provided beneath both drain electrode 17 and source electrode 21, TFT channel 22, and photo-imageable passivation or insulating layer 25. Source electrode 21 may be in electrical communication with, for example, a pixel electrode of an LCD pixel, or as illustrated in FIG. 3 a collector or pixel electrode of an imager pixel. Channel 22 of TFT 11 divides contact layer system 45 into two separate parts in some embodiments, the first part being located between drain electrode 17 and semiconductor layer 15, and the second part being located between source electrode 21 and semiconductor layer 15. Channel 22 also separates and spaces source 21 from drain 17.

Still referring to the FIG. 5 TFT 11, as discussed above, contact layer system 45 is variable doped so that its doping density adjacent semiconductor layer 15 is less than its doping density adjacent the source/drain electrode(s). In other words, contact layer system 45 is lightly doped (n− or p−) adjacent semiconductor layer 15, and more heavily doped (n+ or p+) adjacent the corresponding source and/or drain electrode (21 or 17). In certain preferred embodiments, at least the intermediate or central areas of layer system 45, in between the lightly and heavily doped edge portions, have a doping density which increases as a function of the thickness of layer system 45 (e.g. see FIGS. 8–11), with the doping density increasing as portions of system 45 get closer to the source and drain electrodes 21 and 17. The variable doping density of system 45 in the FIG. 5 TFT, surprisingly, results in reduced leakage current and increased mobility for TFT 11.

Variably doped contact layering system 45, according to certain embodiment of this invention, is from about 150–1200 Å thick, preferably from about 250–1000 Å thick, and is most preferably about 500 Å thick when n-type phosphorus dopant is used to dope an a-Si based contact layering system 45. In certain embodiments, layering system 45 is provided with a base semiconductor layer such as amorphous silicon (a-Si) which is then doped in a variable manner through the thickness of at least most of the layer/system.

Figure 6:
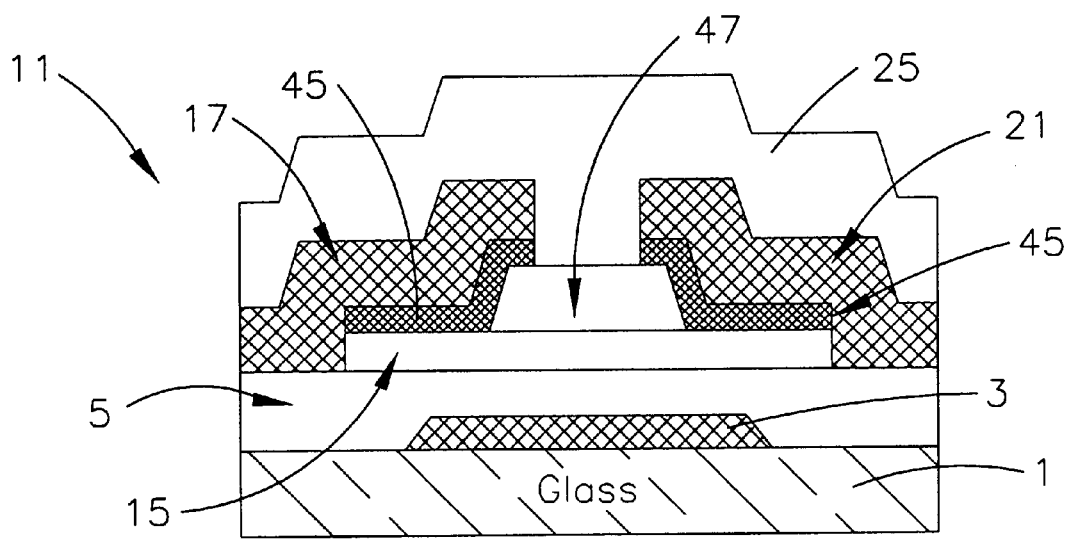
FIG. 6 is a side cross-sectional view of a TFT in accordance with another embodiment of this invention, this TFT being applicable to both the FIGS. 3–4 imager embodiment and other applications such as LCDs.

FIG. 6 is a side cross-sectional view of a TFT structure 11 according to another embodiment of this invention. The TFT of FIG. 6 may be used in the FIGS. 3–4 imager embodiment, or alternatively may be used in other applications including imagers and LCDs. The FIG. 6 TFT 11 differs from the FIG. 5 TFT, in that dielectric layer 47 is provided. The FIG. 6 TFT may be referred to as a bottom-gate tri-layer (TL) TFT, while the FIG. 5 TFT may be referred to as a bottom-gate BCE TFT. The contact layering system 45 in the FIG. 6 TFT is variably doped as discussed above with regard to the FIG. 5 embodiment and other embodiments of this invention described herein, so that the doping density is light adjacent semiconductor layer 15 and dielectric 47, when compared to a higher doping density of system 45 adjacent the source 21 and drain 17 electrodes. The closer to the source and drain, the higher the doping density.

In each of the FIG. 5 and FIG. 6 embodiments of this invention, contact layer system 45 may be variably doped with an n-type dopant such as phosphorous, As, and/or Sb. An n-type (n+ or n−) of dopant means that there are more free electrons than in an intrinsic or substantially undoped layer. In amorphous silicon (a-Si) thin film TFTs of this invention, semiconductor layer 15 may be intrinsic a-Si, while doped contact layer system 45 may be made up of n+ doped a-Si (e.g. phosphorous doped a-Si). When phosphorous doping is used, for example, $PH_3$ doping gas is used together with $SiH_4$ (source gas) and $H_2$ gases in known PECVD deposition system. For heavy phosphorous (n+) doping (i.e. the amount of doping immediately adjacent the source and drain electrodes) of an a-Si inclusive contact layer, $PH_3$ doping gas is from about 0.2% to 2.0% of the source gas volume in the plasma enhanced chemical vapor deposition system (PECVD) of the overall volume made up of $PH_3$ and $SiH_4$ (i.e. the $PH_3$ doping gas is about 0.2–2.0% of the volume of $PH_3$ and source $SiH_4$) (the amount of $H_2$ gas is not considered in this regard). Meanwhile, an example of being lightly doped (i.e. an exemplary doping immediately adjacent the semiconductor layer 15) in a phosphorous doped a-Si layering system 45, would be the $PH_3$ being from about 0.001% to 2.0% of the $PH_3+SiH_4$ in the PECVD gas flow system. The very low dopant density (e.g. about 0.001%) can be achieved by turning off dopant gas flow just before the deposition and doping the film with the dopant gas residue in the chamber. Therefore, one need only adjust the $PH_3$ or dopant gas flow in the PECVD deposition system in order to cause layering system 45 to be deposited in accordance with this invention with a doping density which varies through its thickness. The $SiH_4$ (i.e. semiconductor or source gas) gas flow need not be adjusted during deposition of system 45, although it may be in certain embodiments. This invention thus requires no additional process steps other than gas flow adjustment (i.e. no extra masks, resists, etc.), and is compatible with conventional TFT manufacturing.

In an alternative embodiment of this invention, a p-typed of dopant (e.g. boron) may be used instead of an n-type of dopant in order to variably dope layering system 45. The amount of p-type dopant in highly (+) and lightly (−) doped areas is similar to the gas volume amounts discussed above with regard to $PH_3$ (e.g. from about 0.001% to 2.0% of the volume of the dopant gas and $SiH_4$ combined). When boron is used to dope layering system 45 in a p+ or p− manner, the $PH_3$ would be replaced by a boron doping gas such as $BF_3$ or $B_2H_6$.

Figure 7:
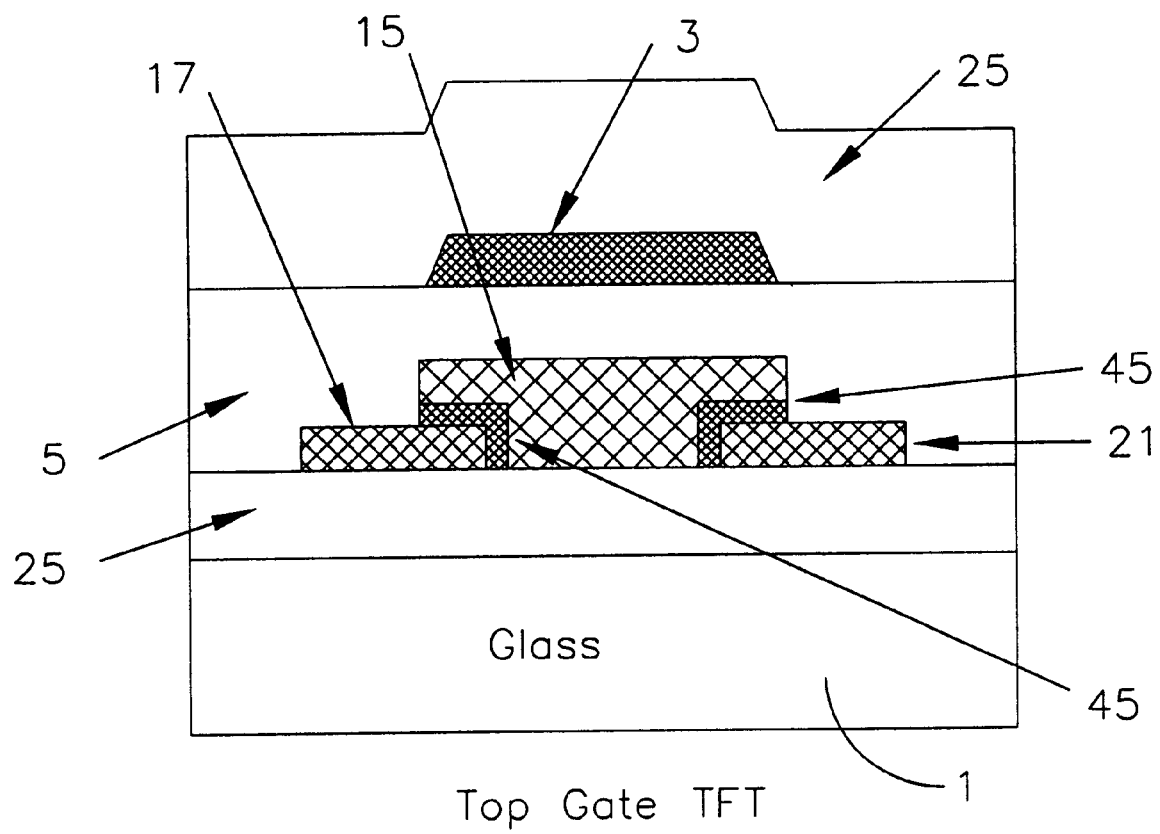
FIG. 7 is a side cross sectional view of a top-gate TFT structure according to an embodiment of this invention, including a variably doped contact layer system.

FIG. 7 shows a top-gate TFT which may include a variably doped contact layer system 45 according to certain embodiments of this invention, with the heavy doping (+) density adjacent the source and drain electrodes. It is noted that while previous embodiments included only one photo-imageable layer 25, the FIG. 7 embodiments includes two such insulating layers 25.

Thus, in certain embodiments (e.g. FIGS. 3–7), the contact layering system 45 has a first doping density adjacent semiconductor layer 15 and a second doping density adjacent the source and drain electrodes. In certain embodiments, the second doping density includes at least twice as much dopant (e.g. phosphorus dopant) as the first doping density (and preferably at least three times as much), so that the variably doped layering system is much more heavily doped adjacent the source and drain electrodes than adjacent the semiconductor layer 15 (see FIG. 13). Both the first and second doping densities are greater than the average doping density of semiconductor layer 15, and layer 15 is preferably not doped at all (or intrinsic) in certain embodiments of this invention.

In certain embodiments of this invention, thin film semiconductor layer 15 (e.g. intrinsic a-Si) is from about 1,000 to 4,000 Å thick, and more preferably from about 1,000–3,000 Å thick, and may be about 2,000 Å thick in certain embodiments. Gate insulating layer 5 (e.g. silicon nitride or silicon oxide) may be from about 2,000–3,000 Å thick in certain embodiments. Optionally, gate layer 3 may be Ta in certain embodiments and anodized. For example, a TaO layer from about 1,400–1,800 Å may be formed for gate 3. Source and drain electrodes 17 and 21 may be from about 500–2,000 Å thick in certain embodiments, more preferably about 1,000–1,200 Å thick when the source and drain are of e.g. chromium (Cr). However, when the source and drain are of molybdenum (Mo), they may from about 2,000–7,000 Å thick, more preferably about 5,000 Å thick. Contact layer system 45 may be from about 150–1200 Å thick. Insulating layer 25 (e.g. a photo-imageable organic acrylic such as Fuji Clear) may be from about 1.5–3.5 μm thick and have a dielectric constant less than about 5.0.

Figure 8:
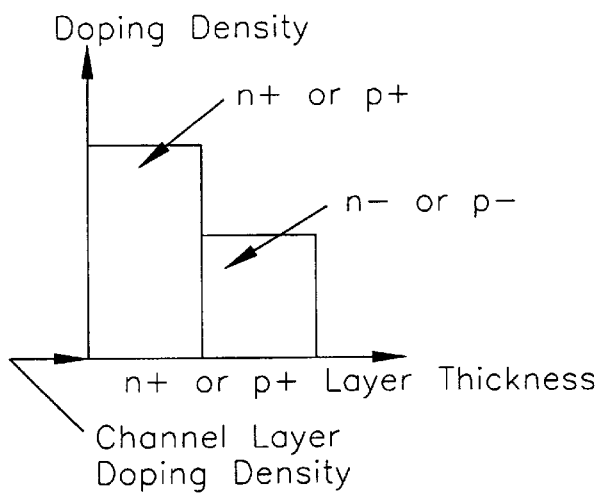
FIG. 8 is a doping density versus layer thickness graph illustrating that contact layer systems for TFTs in accordance with certain embodiments of this invention have a higher (+) doping density adjacent source/drain electrodes and a lower (−) doping density adjacent the semiconductor or channel layer.

FIG. 8 is a graph illustrating that layering system 45 is highly doped (n+ or p+) adjacent the source and drain electrodes, and is lightly doped (n− or p−) adjacent intrinsic semiconductor layer 15.

Figure 9:
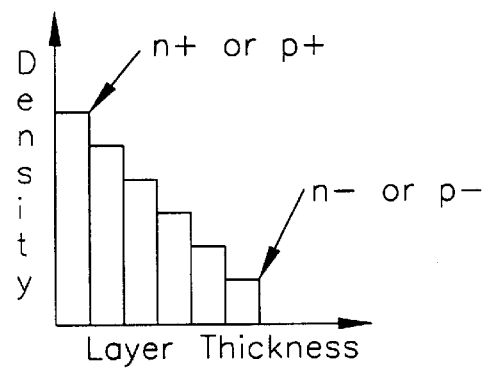
FIG. 9 is a doping density versus layer thickness graph illustrating a step-like decrease in doping density of the contact layer system from a high (+) density adjacent the source/drain metal layers down to a lower (−) density adjacent the semiconductor layer. [This is applicable, of course, to both top and bottom gate TFTs.]

FIG. 9 is a graph illustrating doping density versus contact layer thickness. FIG. 9 illustrates layering system 45 being variably doped in a step-like manner. System 45 is heavily doped (either n+ or p+) adjacent to source and drain electrodes, and is lightly doped (either n− or p−) adjacent the semiconductor layer 15 with a step-like linear doping density variation therebetween. The doping gas flow input is simply adjusted in a step-like or non-continuous manner during the continuous deposition of layer system 45 in order to cause the step-like doping variation shown in FIG. 9. If FIG. 9 illustrated the entirety of contact layer system 45, then the amount of doping gas (e.g. $PH_3$ for n-type doping, or $BF_3$ for p-type doping) being added to the $SiH_4$ in the PECVD deposition system would only have to be adjusted upwardly e.g. five separate times during the substantially continuous deposition of layer system 45. In other words, to begin depositing layer system 45 on a bottom-gate TFT, the illustrated n− or p− doping density would be set in the PECVD system, and thereafter the amount of doping gas being utilized would be increased successively e.g. five different times in a step-like manner during the deposition process until layering system 45 was completely deposited on substrate 1 over semiconductor layer 15. It is emphasized that the contact layer system is not limited to the number of differently doped portions shown in FIG. 9, and many different numbers of steps of differently doped areas may be provided (e.g. 2–100). Any number of differently doped layers may be used.

Figure 10:
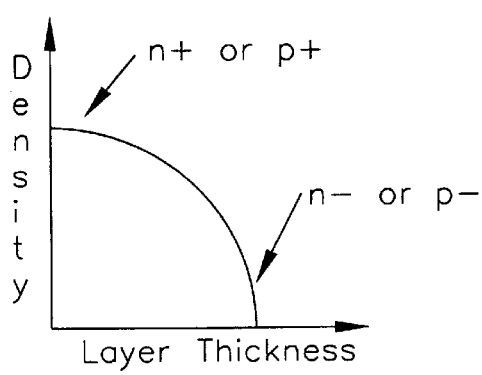
FIG. 10 is a doping density versus layer thickness graph illustrating a gradual and continuous change or variation in doping density of the contact layer system from a high density adjacent the source/drain electrodes down to a low doping density adjacent the semiconductor layer.

FIG. 10 illustrates another way in which the doping density of layering system 45 can be adjusted throughout its thickness in accordance with an embodiment of this invention. As shown in FIG. 10, during the deposition of layering system 45, the amount of doping gas (e.g. $PH_3$) being input to the PECVD system begins at a lightly doped level [n− or p−] (which may be higher than the average doping density in semiconductor layer 15), and is continually or intermittently increased (or decreased in certain top-gate TFT embodiments) by gas volume until the deposition of layering system 45 is complete. The n+ or p+ (highly doped) density is in place when the deposition of layering system 45 is complete.

Figure 11:
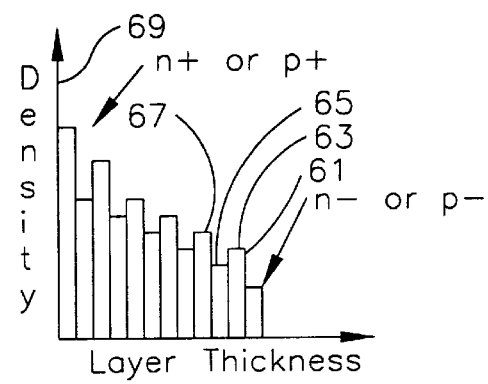
FIG. 11 is a doping density versus layer thickness graph according to still another embodiment of this invention, illustrating a zig-zag type variation in doping density of a contact layer system between the semiconductor layer and source/drain electrode(s).

FIG. 11 is a contact layer thickness versus density graph illustrating yet another way in which the doping density can be varied in layering system 45 according to an embodiment of this invention. In accordance with the FIG. 8 embodiment, the amount of doping gas would begin at an amount corresponding to the illustrated n− or p− dopant density. After a predetermined time of deposition of a first portion of layering system 45, the amount of doping gas would be increased 61 to a higher doping density level 63. Layering system 45 would then be deposited for a predetermined amount of time at doping density 63. The amount of doping gas would then be decreased to a doping density level 65. Layering system 45 would then be deposited for a predetermined amount of time at doping density 65. The amount of doping gas would then be increased to a level 67, and system 45 would be deposited for a predetermined amount of time at doping density 67. This process would continue, up until the deposition of layering system 45 was completed at doping density 69.

It is noted that while the graphs of FIGS. 8–11 generally slope downward as system 45 thickness increases, in certain other embodiments (e.g. top-gate TFT embodiments) the doping density may increase (i.e. upward slope) as system 45 gets thicker.

Figure 12:
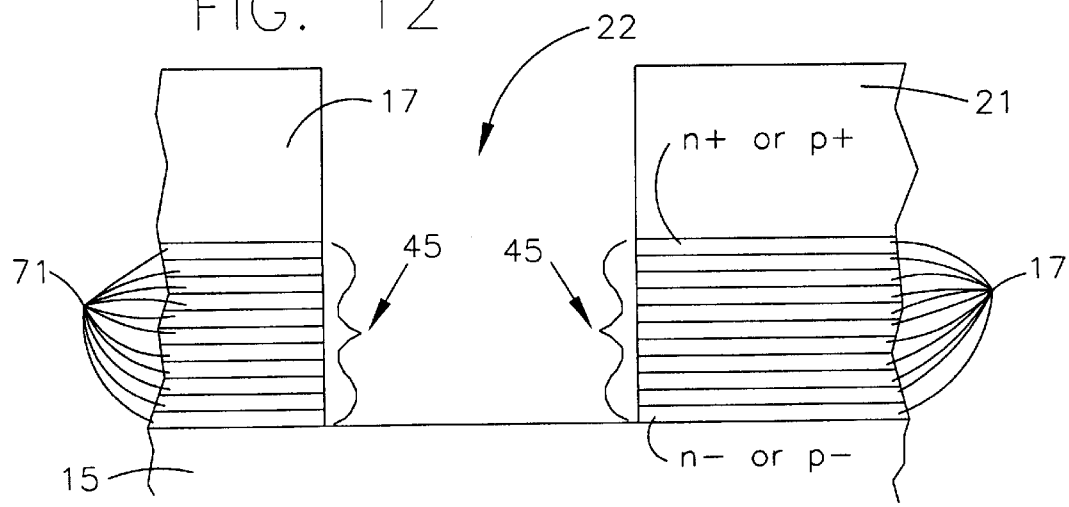
FIG. 12 is a partial cross-sectional view of a contact layer system according to an embodiment of this invention, illustrating a plurality of differently doped portions of the contact layer system (i.e. according to any of the FIGS. 3–9 or 11 embodiments).

FIG. 12 is a partial side cross-sectional view of contact layering system 45 in accordance with the FIG. 5 and FIG. 9 embodiment of this invention. As illustrated, there are a plurality of differently doped portions 71 throughout the overall thickness of layering system 45. In certain embodiments of this invention, each portion 71 is differently doped. For example, layering system 45 may begin at a lightly doped density (n− or p−) adjacent semiconductor layer 15 and the doping density than be increased in a step-like manner up (e.g. FIG. 6) until system 45 is complete at a doping density of n+ or p+.

Of course, whenever the deposition of system 45 begins using an n-type of dopant, it will only thereafter use an n-type of dopant. In other words, n-type and p-types of dopants will not be intermixed in a given layering system 45. Either one or the other is utilized.

FIG. 13 shows SIMS analysis result on the phosphorous dopant density profiles for conventional n+ layers and also for a system according to an embodiment of this invention (graded phosphorous-doped layer). The dopant density was controlled by varying the gas flow ratio of the doping gas ($PH_3$) to the source gas ($SiH_4$) The sharp drop of density in the depth larger than 550 Å for both graded n+ layer (thick solid line) and conventional n+ layer (thin solid line) is due to the diffusion of dopant from n+ layer 45 to i semiconductor layer 15. The gas ratio [$PH_3/SiH_4$] was 1/500 before the n+ layer deposition starts and reduced to 0/5 at the time deposition starts. Thus, the remaining doping gas was depleted during contact system 45 deposition and resulted in a hill-like dopant distribution in the first 100 Å of n+ layer 45 near the interface with intrinsic semiconductor layer 15. Then, the gas ratio was increased to 1/500 again and then to 1/50 gradually thereby making a slowly increased dopant profile below depth less than 500 Å. Of course, FIG. 13 applies to a bottom-gate TFT and intrinsic layer 15 was deposited prior to layer 45.

Figure 14:
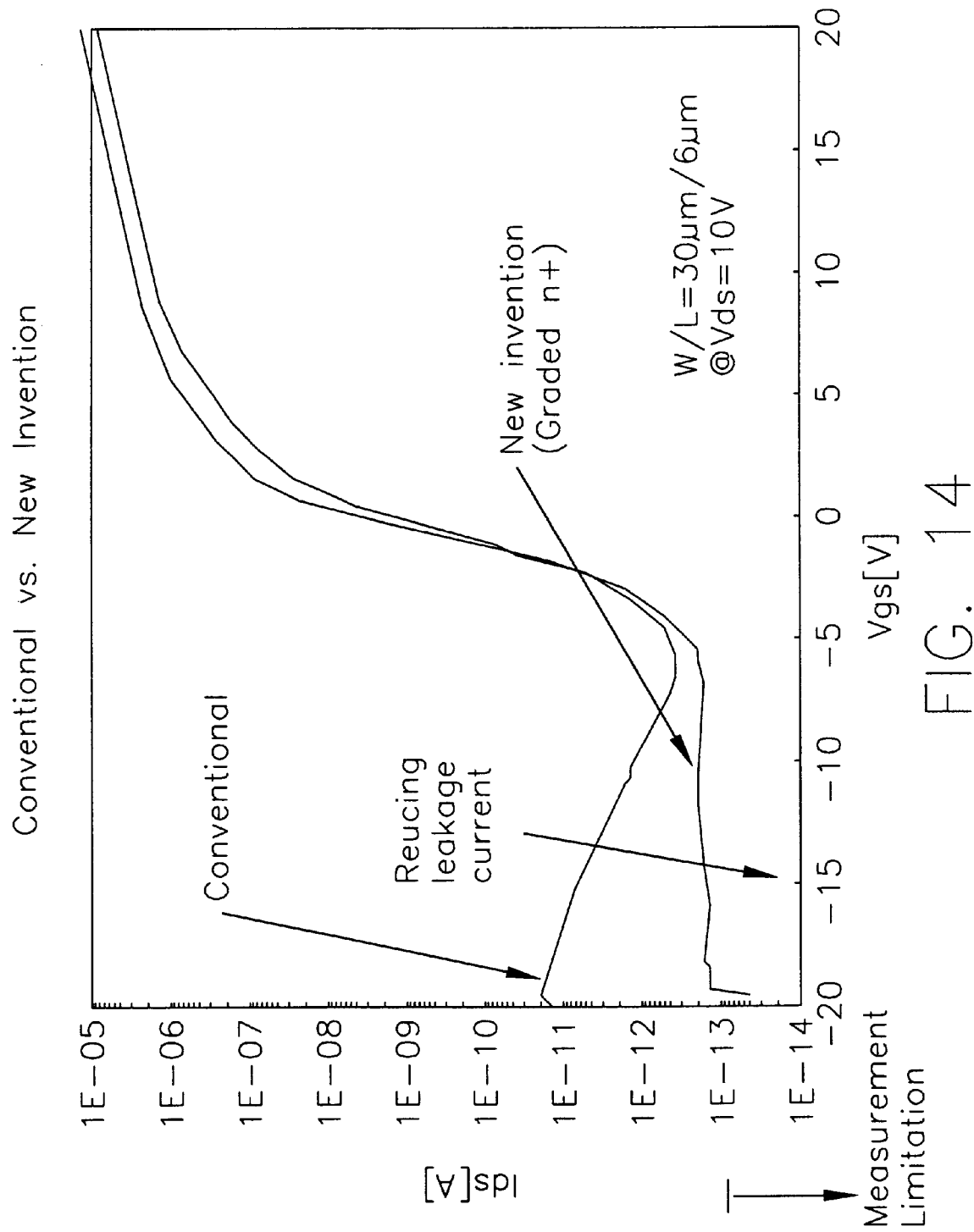
FIG. 14 is a voltage vs. current flow graph showing conventional TFTs versus TFTs of certain embodiments this invention, this graph illustrating a reduced level of leakage current for TFTs in accordance with embodiments of this invention.

FIG. 14 is a current versus voltage graph comparing a TFT in accordance with this invention (i.e. graded n+) with a conventional TFT. The horizontal axis of the FIG. 14 graph represents the voltage which is applied to the gate electrode 3 of a TFT. The vertical axis represents the current, in amps (A), which flows between the source and drain electrodes 17 and 21. The vertical or current axis of the FIG. 14 graph begins with a current of $1 \times 10^{-14}$ amps and goes up to a current of $1 \times 10^{-5}$ amps. In the FIG. 14 graph, $V_{ds}$ (the voltage difference between the source and drain) was held constant at 10 volts, the width of the TFT channel 22 was 30 μm, and the length of the linear TFT channel was 6 μm, and a temperature of 20 degrees C. was used. As shown in the left-hand portion of the FIG. 14 graph (i.e. when the TFT was in the off-state as the gate voltage was zero or less), the current flow (i.e. leakage current) between the source and drain electrodes was much less for the graded n+ phosphorous doped TFT of this invention than for the conventional TFT. This illustrates a reduced leakage current resulting from the variably doped contact layering systems 45 of this invention. In FIG. 14, at the −20 volt portion of the horizontal volts axis, the lowest line represents a TFT with variably doped contact layering systems 45 in accordance with certain embodiments of this invention.

Figure 15:
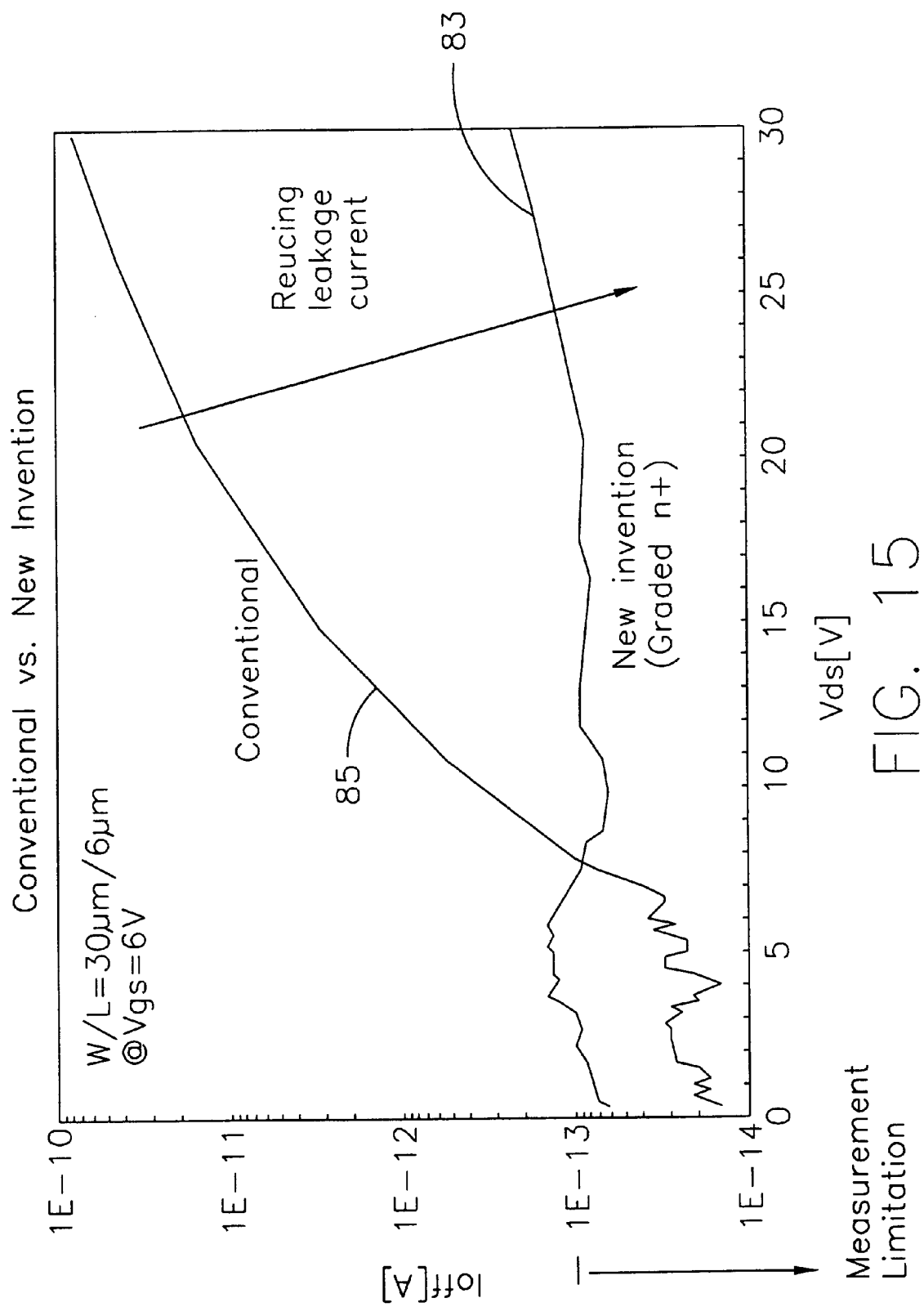
FIG. 15 is a voltage vs. current graph comparing TFTs in accordance with certain embodiments of this invention with conventional TFTs, showing reduced leakage current in embodiments of this invention.

FIG. 15 is a voltage versus current graph comparing a TFT in accordance with this invention with a conventional TFT, when the TFTs are in the off-state. For the FIG. 15 graph, the voltage applied to the gate electrode was maintained at −6 volts, and a temperature of 20° C. was used. Thus, the TFTs were in the off-state. As shown in FIG. 15, when the voltage differential between the source and drain electrodes reached 30 volts (e.g. 30 volts being at the source electrode and 0 volts at the drain electrode), the leakage current or current flow ($I_{off}$) between the source and drain electrodes was much smaller 83 for the TFT in accordance with this invention than for conventional TFT 85. In FIG. 15, looking at the right-most portion of the graph, the lowermost line or plot 83 represents a TFT including a variably doped contact layering system 45 in accordance with an embodiment of this invention, while the uppermost line 85 represent a conventional TFT with a constant density doped contact layer. TFT represented by line 83 had a channel width of 30 μm and a channel length of 6 μm.

Figure 16:
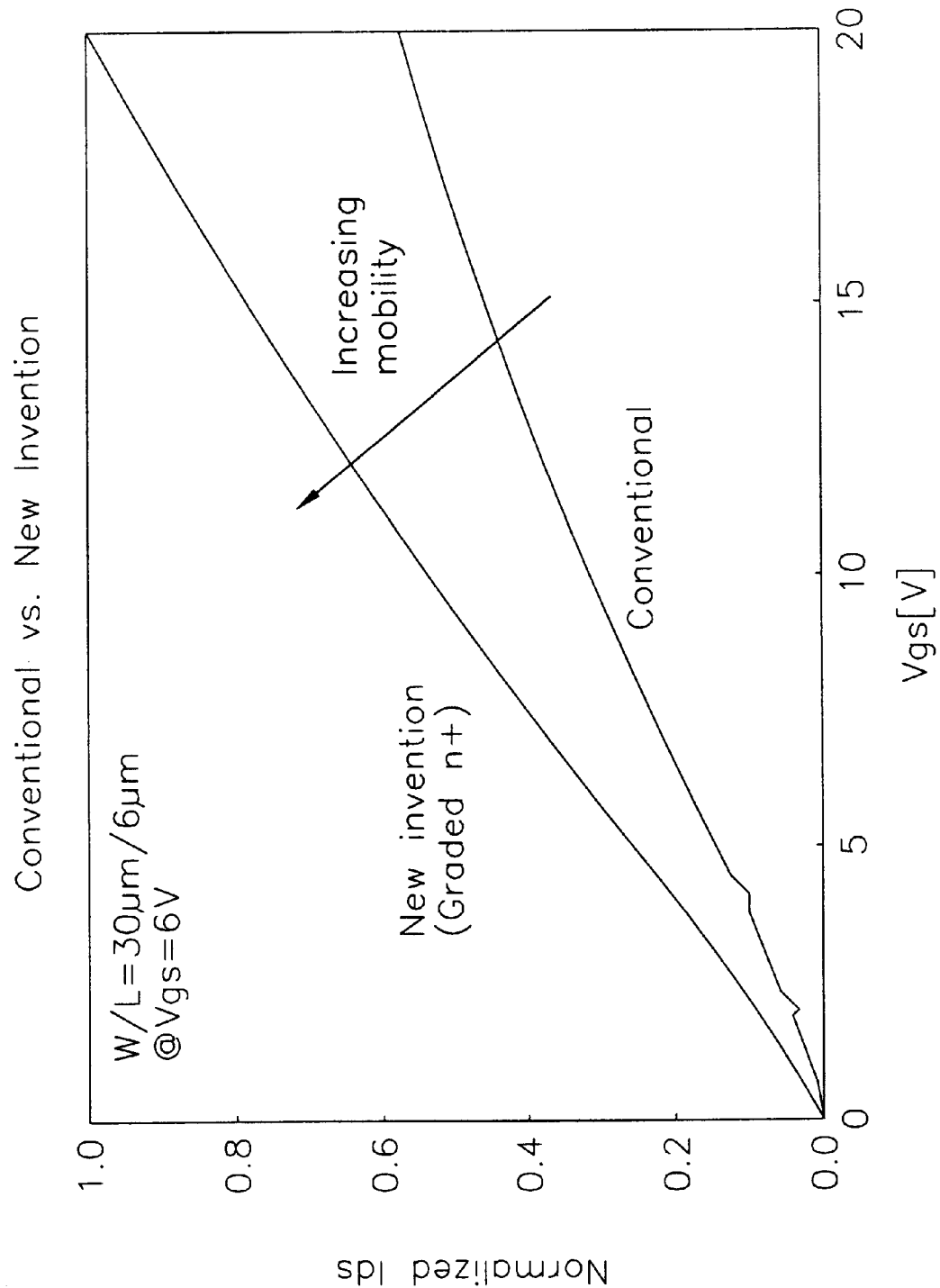
FIG. 16 is a voltage vs. normalized current graph comparing TFTs in accordance with embodiments of this invention with conventional TFTs, showing increased mobility in certain embodiments of this invention.

FIG. 16 is a graph illustrating normalized $I_{ds}$ vs. voltage for a TFT in accordance with certain embodiments of this invention, as compared to a conventional TFT. This graph shows increased mobility.

With regard to manufacturing, it will briefly be described, for exemplary purposes only, how the FIG. 5 TFT is manufactured in accordance with one embodiment of this invention. Firstly, substantially transparent substrate 1 is provided. Thereafter, gate electrode 3 (deposited and patterned), gate insulating layer 5, and intrinsic a-Si semiconductor layer 15 are deposited on substrate 1 as described and illustrated in, for example, U.S. Pat. No. 5,641,974, the disclosure of which is hereby incorporated herein by reference. Thereafter, a substantially continuous or blanket contact layering system 45 is deposited on substrate 1 over top of semiconductor layer 15 in a manner similar to that described above (e.g. see any of FIGS. 8–11) [optionally, during the same process used to deposit layer 15]. Following the deposition of contact layering system 45, an array of TFT islands or areas may be formed from layers 15 and 45 on substrate 1 by way of etching, for example, so that the TFT source/drain metal layers can be deposited thereon. Optionally, one of the TFT metal source/drain layers may be deposited before forming the TFT islands, with layers 15, 45, and 17/21 thereafter being patterned to form an array of the FIG. 5 TFT structures across substrate 1.

According to certain embodiments, following the formation of the TFT islands in which layers 15 and 45 are patterned into an array of islands on the substrate, a source/drain metal sheet or layer (which results in the drain and source electrodes) is deposited on the substrate over top of contact layering system 45 and gate insulating layer 5. The source/drain metal layer may be chromium, Mo, or any other suitable conductive material. The deposited source/drain metal layer is then patterned (e.g. masked and etched) to form source electrodes 21 and drain electrodes 17, and channels 22 in the electrode and contact layers. Then, substantially transparent organic insulating layer 25 is deposited on substrate 1 and thereafter photoimaged in order to define a plurality of vias or contact holes 39, 41, and 43 therein. Thereafter, either a pixel electrode for an LCD or a collector electrode for an imager is deposited on the substrate over top of insulating layer 25. The pixel electrode layer is patterned into a plurality of discrete pixel electrodes. Each pixel electrode contacts a corresponding source electrode 21 of a TFT 11 through a contact hole 39 defined in layer 25. In imager embodiments, each collector electrode may also contact a dielectric layer of a storage capacitor 9 through one or more vias or contact holes.

In sum, variably doped contact layer systems 45 herein may be used in conjunction with any type of conventional TFT (e.g. bottom gate TFTs, top-gate TFTs, etc.). For example, variably doped contact layer systems herein may be used to replace the constant doping density contact layers of any of U.S. Pat. Nos. 5,641,974; 5,532,180; 5,614,427; or 5,650,358, the disclosures of which are hereby incorporated herein by reference.

Once give the above disclosure, many other features, modifications, and improvements will become apparent to the skilled artisan. Such other features, modifications, and improvements are therefore considered to be a part of this invention, the scope of which is to be determined by the following claims.

We claim:

1. An imager for outputting signals as a function of incoming radiation, including at least one thin film transistor (TFT), the imager comprising:
   a substrate;
   the at least one TFT being supported by said substrate, the TFT being in communication with a storage capacitor;
   the at least one TFT including:
   (a) a gate electrode;
   (b) a source electrode in electrical communication with a collector electrode of the storage capacitor;
   (c) a drain electrode, wherein said source and drain electrodes are spaced from one another so as to form a TFT channel therebetween;
   (d) a semiconductor layer disposed between said gate electrode and said drain electrode;
   (e) a variably doped contact layering system disposed between (i) said semiconductor layer, and (ii) at least one of said source and drain electrodes; and
   (f) wherein said variably doped contact layering system has a first doping density adjacent said semiconductor layer and a second doping density adjacent at least one of said source and drain electrodes, and wherein said first doping density is less than said second doping density by an amount sufficient to reduce off-state leakage current and to increase mobility of the TFT.

2. The imager of claim 1, wherein said semiconductor layer is an intrinsic semiconductor layer, and wherein application of a voltage to said gate electrode causes charge stored in said collector electrode to be read out using the TFT.

3. The imager of claim 1, wherein said contact layering system is one of n-type doped and p-type doped.

4. The imager of claim 1, wherein a dopant including one of (i) phosphorus, boron, As, and Sb is utilized in the contact layering system, with different amounts of the dopant being utilized throughout a thickness of the contact layering system so as to define the first and second doping densities.

5. The imager of claim 1, wherein the second doping density is defined by using from about 0.2 to 2.0% dopant gas by volume of a total volume defined by the dopant gas and a silicon based semiconductor gas.

6. The imager of claim 1, wherein the TFT is a bottom gate TFT, said semiconductor layer includes amorphous silicon, and a gate insulating layer is disposed between said semiconductor layer and said gate electrode.

7. The imager of claim 1, wherein said semiconductor layer includes amorphous silicon, and wherein said contact layering system includes amorphous silicon doped with an impurity including one of: phosphorus, boron, As, and Sb.

8. The imager of claim 1, wherein the entire contact layering system is doped by an impurity in an amount of at least about 0.1% of dopant, and the semiconductor layer is doped by an impurity in an amount less than about 0.1%.

9. The imager of claim 8, wherein a substantial portion of said contact layering system is doped by an impurity in an amount of at least about 0.5% of dopant by volume.

10. The imager of claim 1, wherein said contact layering system includes a variably doped semiconductor layering system and is from about 150–1200 Å thick.

11. A thin film transistor (TFT) structure comprising:
    a substrate;
    a conductive gate electrode in communication with a gate address line;
    a conductive drain electrode in communication with a drain address line;
    a conductive source electrode in communication with a device electrode;
    a TFT channel defined between said source and drain electrodes;
    a semiconductor layer defining a current flow channel between said source and drain electrodes, said semiconductor layer being disposed between (i) said gate electrode, and (ii) said source and drain electrodes; and
    a semiconductor-inclusive variably doped contact layer system including at least one layer, said variably doped contact layer system contacting said semiconductor layer and at least one of said source and drain electrodes, said contact layer system being variably doped through its thickness in order to reduce TFT off-state leakage current.

12. The TFT structure of claim 11, wherein said contact layer system directly contacts each of said source electrode, said drain electrode, and said semiconductor layer, and wherein said contact layer system is from about 150–1200 Å thick at a portion thereof; and
    wherein the TFT structure is included in an array of similar TFTs in one of an x-ray imager and a liquid crystal display.

13. The TFT structure of claim 11, wherein said contact layer system has a first doping density adjacent said semiconductor layer and a second doping density adjacent at least one of said source and drain electrodes, and wherein said second doping density includes at least about twice as much dopant than said first doping density so that said contact layer system is more heavily doped adjacent at least one of said source and drain electrodes than adjacent said semiconductor layer.

14. The TFT structure of claim 13, wherein said second doping density includes at least about three times as much dopant than said first doping density so that said contact layer system is more heavily doped adjacent at least one of said source and drain electrodes than adjacent said semiconductor layer.

15. A method of making a thin film transistor (TFT) structure, the method comprising the steps of:

providing a substrate;

providing a gate electrode;

providing source and drain electrodes;

forming a semiconductor layer on the substrate;

depositing a variably doped contact layer system, including at least one layer, on the substrate in a position so that the variably doped contact layer system is disposed at least partially between the semiconductor layer and the source electrode; and said depositing step including utilizing a plurality of gases during said depositing in order to deposit the contact layer system, the gases including at least a dopant gas and a semiconductor or source gas and wherein the dopant gas and the semiconductor or source gas define a gas volume, and during said depositing step the amount of dopant gas provided in the gas volume is increased from a first percentage amount to a higher second percentage amount by volume in order to increase the doping density of the contact layer system through the thickness of the contact layer system so as to reduce off-state leakage current characteristics of the TFT.

16. The method of claim 15, wherein the first amount is from about 0.1% to 0.5% dopant gas volume of said gas volume made up of the dopant gas and the semiconductor gas, and the second amount is from about 0.5 to 2.0% dopant gas volume of said gas volume.

17. The method of claim 15, wherein said semiconductor gas includes $SiH_4$ and said dopant gas includes one of $PH_3$, $BF_3$, and $B_2H_6$.

18. The method of claim 15, wherein the TFT is a bottom-gate TFT, the semiconductor layer includes a-Si, the contact layer system includes a-Si doped with an impurity in varying density through its thickness, and said depositing step includes plasma enhanced chemical vapor deposition of the variably doped contact layer system.

19. The method of claim 15, wherein the TFT is used as a selective switching device in one of an x-ray imager and a liquid crystal display.

20. The method of claim 15, wherein the steps are not performed in the order in which they are recited.

* * * * *